United States Patent [19]

Liu

[11] Patent Number: 4,461,617
[45] Date of Patent: Jul. 24, 1984

[54] CARRIER FOR SEMICONDUCTORS

[75] Inventor: Donghwa Liu, Rancho Palos Verdes, Calif.

[73] Assignee: ASQ Boats, Inc., Tustin, Calif.

[21] Appl. No.: 436,299

[22] Filed: Oct. 25, 1982

[51] Int. Cl.³ .......................... F27B 9/00; B61B 13/00
[52] U.S. Cl. ......................................... 432/253; 432/5;
432/241; 446/470; 208/80 R
[58] Field of Search .................. 432/253, 241, 5, 6;
280/80 R; 118/500; 46/211

[56] References Cited

U.S. PATENT DOCUMENTS

| | | | |
|---|---|---|---|
| 1,309,240 | 7/1919 | Chappuis | 46/221 |
| 2,593,015 | 4/1952 | Dreher | 432/253 |
| 3,233,358 | 2/1966 | Dehm | 46/221 |
| 3,483,654 | 12/1969 | LaBranche et al. | 46/221 |
| 3,511,518 | 5/1970 | Freber | 280/80 R |
| 3,811,829 | 5/1974 | Wesson et al. | 432/5 |
| 4,193,639 | 3/1980 | Panly et al. | 46/221 |
| 4,389,967 | 6/1983 | Shimada et al. | 432/241 |

*Primary Examiner*—Henry G. Yuen
*Attorney, Agent, or Firm*—Knobbe, Martens, Olson & Bear

[57] ABSTRACT

In a wheeled carrier for transporting wafers of semiconductor material during processing, the wheels are non-rotatably mounted on axles and each pair of wheels has either central recesses on their outer faces accepting sub shafts in allignment with the axle, or central stub shafts projecting into recesses in a support structure, for rotation of the wheel/axle assemblies about opposing pairs of stub shafts. The stub shafts, and optionally the inner surfaces of the recesses, are highly polished and shaped to minimize resistance to motion caused by friction between the contact surfaces of the recess and stub shafts since the carrier is made of refractory material such as quartz having a high coefficient of resistance. To minimize accumulation of contaminating particles in the recesses in the wheels, passages are provided through the wheels between the recess and the inner face of each wheel for easier access to the bottom of the recesses.

14 Claims, 4 Drawing Figures

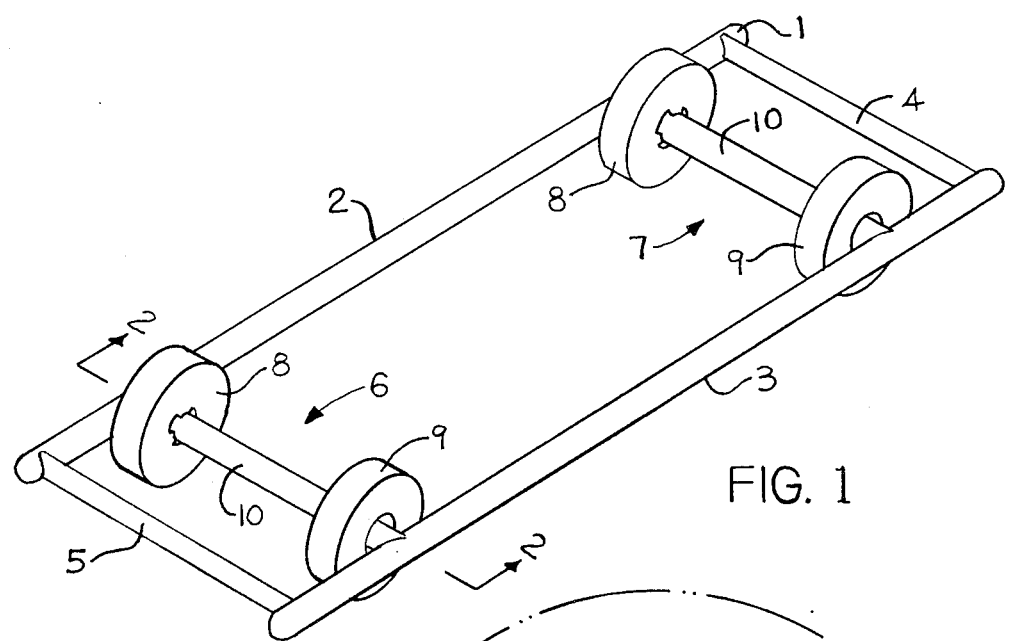
FIG. 1
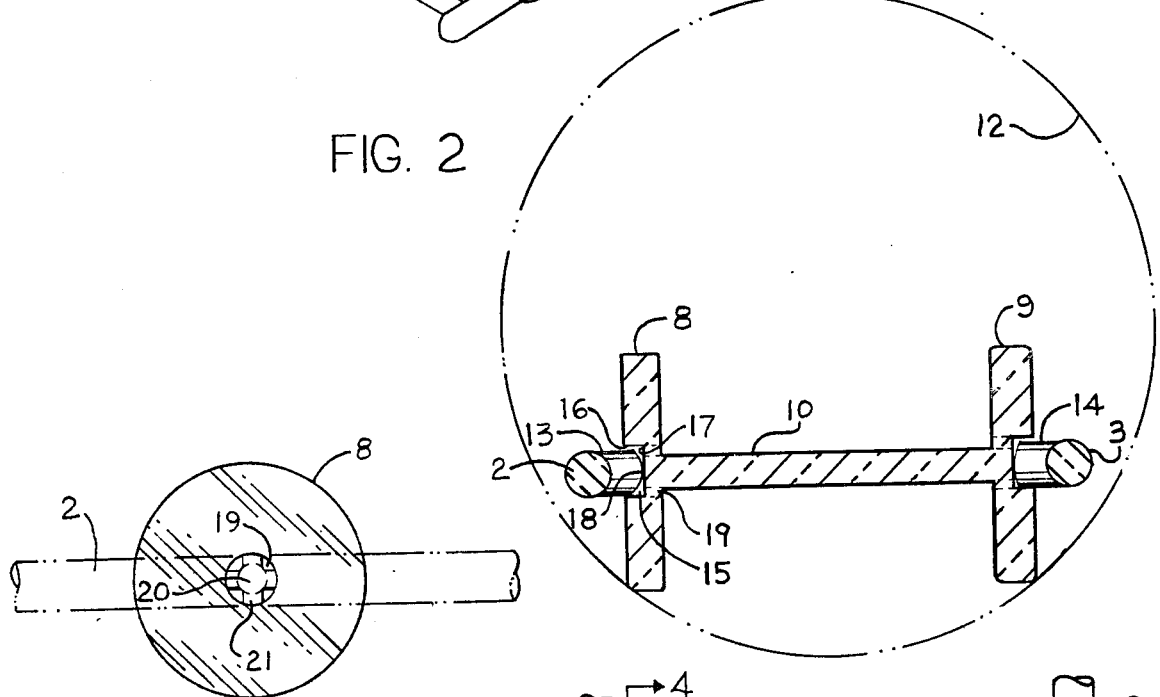
FIG. 2
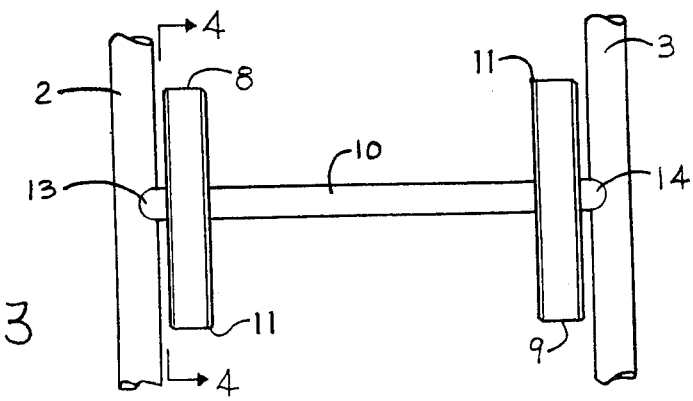
FIG. 4
FIG. 3

CARRIER FOR SEMICONDUCTORS

BACKGROUND OF THE INVENTION

This invention is concerned with devices for transporting semiconductors during their fabrication.

In the manufacture of semiconductors, wafers of semiconductor material are placed in a tubular furnace for various treatment such as oxidation, diffusion, annealing and low pressure chemical vapor deposition. Typically, gaseous materials are generated for deposition on the wafers to form layers of different current type. The wafers are usually supported in parallel, one behind the other, and on their edges in a rack which is often referred to as a boat. The rack may be detachable from, or integral with, a support which serves to carry the rack, or a series of racks, into and out of the furnace. The term "carrier" will be used herein to mean either the support for one or more detachable racks or the support and rack when the two are inseparable. Since very high temperatures, about 1,000° to 1,300° C., are generated in the furnace, the carrier and furnace are made from the refractory materials such as silica or quarts, usually the latter.

It is of paramount importance in the manufacture of semiconductors that the materials, equipment and environment used be ultra pure. Any undesirable impurities can spoil the semiconductor. Clearly spoilage reduces the efficiency of the process, increases costs and waste and, if passed undetected, can lead to very expensive breakdown of equipment where the semiconductor is subsequently used.

Some wafer carriers are in the form of a sled for sliding in and out of the furnace. This design suffers from the disadvantage that the sliding can dislodge particles deposited on the walls of the furnace to contaminate the wafers. Other designs have wheels to roll the carrier in and out of the furnace, but wheels also present problems. Since such high temperatures are experienced in the furnace, normal wheel bearings and lubricants cannot be used. Without such aids to smooth the motion the moving parts of the carrier are in direct contact and since the carrier is made of materials such as quartz the wheels can stick, since the coefficient of friction between quartz is high. If the wheels stick, the carrier can slide, dislodging particulate contamination as mentioned above. Alternatively, or in addition, when the wheels stick, the carrier can move with a jerky motion which jostles the wafers to damage them or realign them so that all the wafers in a batch do not receive uniform treatment.

One approach in the prior art to overcome these problems has been to encapsulate the contact surfaces of the moving parts with graphite thus providing a sealed in lubricant, but this is expensive and complicated. Without lubricant or some form of bearing, there cannot be tight tolerances between the wheels and axles without binding. Alternatively a large tolerance may prevent the wheels from operating properly as they will flop to one side on the axles. Attempts have been made to avoid this by supporting the wheels with quartz washers on either side but this only increases the quartz contact area and hence the resistance to motion, and also provides traps where deposits can collect for contamination of the wafers. Another alternative is to use broad wheels of substantially the same width as the axles, but this also increases quartz to quartz contact and provides a large mass which increases the length of time for which the carrier and wafers must be cooled, thereby increasing processing time and costs.

There is therefore a need for a wheeled carrier of a relatively simple and inexpensive construction and which moves smoothly without sliding or jerking which does not trap contaminating particles.

SUMMARY OF THE INVENTION

The invention provides such a construction which avoids the use of built in lubricants and yet which allows smooth and facile movement despite a high coefficient friction between the moving contact surfaces of the carrier.

According to the invention there is provided a wheeled carrier for use in semiconductor processing having one or more pairs of wheels, each pair being mounted for rotation between a pair of stub shafts projecting into recesses in the outer surfaces of the wheels, or projecting from said surfaces into recesses in a structure for supporting the wheels.

Preferably the wheel and axle assembly is of unitary construction and the entire carrier is made of refractory material such as quartz.

To minimize resistance to motion caused by friction between contact surfaces of the stub shafts and the interior surface of the recesses, the contact areas are highly polished and preferably shaped to minimize that area. For example, the ends of each stub shaft may be rounded to reduce the contact area with the bottom of each recess. The bottom of the recess is usually flat, but alternatively, or in addition, the bottom surface of the recess may be domed to offer a smaller contact area to the end of the stub shaft.

Preferably, the stub shafts project into recesses in the center of the outer surfaces of the wheels.

In one embodiment, the carrier comprises two of such wheel assemblies spaced apart and mounted on a support structure for holding a rack of semiconductor wafers joined to or separable from the support structure. This support structure conveniently comprises a pair of parallel side bars having the stub shafts projecting inwardly therefrom to mount the wheel assemblies between the bars. The ends of the bars are braced by struts between them for rigidity and to fix the relative position of the bars.

To assist in maintaining the recesses in the wheels free of particles which may contaminate the wafers, the internal diameter of the recess is made greater than the diameter of the axle so that passsages may be formed between the bottom of the recess and the inner face of the wheel for convenient access to the recess. There may be one or more of such passages per recess and each has a cross-section small in comparison to that of the bottom of the recess. The passages open to the periphery of the bottom of the recess adjacent to the recess walls to leave a central area for contact with the stub shafts. When a plurality of passages are used they are arranged symmetrically around the periphery of the bottom of the recess forming a central area with spokes radiating therefrom.

BRIEF DESCRIPTION OF THE DRAWINGS

A preferred embodiment of the invention is illustrated in the accompanying drawing in which:

FIG. 1 is a perspective view of a carrier according to the invention;

FIG. 2 is a sectional view of a wheel and axle assembly of the carrier in FIG. 1, taken along line 2—2;

FIG. 3 is a partial view from above the carrier in FIG. 1 showing a wheel and axle assembly;

FIG. 4 is a sectional view of the assembly in FIG. 3, taken along the lines 4—4.

DETAILED DESCRIPTION OF THE PREFERRED EMBODIMENT

Referring to FIG. 1, there is illustrated an example of a carrier according to the invention having a support structure comprising a peripheral frame 1 formed by parallel side bars 2 and 3 spaced near their ends by struts 4 and 5 of equal length. The side bars and struts are shown as having a generally circular cross-section, but they may have any other cross-sectional shape which provides sufficient strength and rigidity and which is reasonably convenient to manufacture.

Within the generally rectangular framework 1 are mounted two wheel assemblies 6 and 7, one behind the other, between the side bars and near the bracing struts 4 and 5 thereby leaving space between the assemblies to support a rack of semiconductor wafers for processing. As can be seen in FIG. 3, each wheel assembly consists of a pair of wheels 8 and 9 spaced on an axle 10. The circumferential edges of the wheels are bevelled as at 11 for better contact with the inner cylindrical surface of a furnace or storage tube shown in phantom at 12 in FIG. 2. The wheels are non-rotatably mounted on the axle, that is, they are rigidly fixed to the axle. Preferably, this is achieved by having the wheels and axle fixed together or otherwise formed of unitary construction. However, means to fix the wheels to the axle may be used, although such an arrangement generally suffers from the disadvantage of having a more complex shape with more opportunity to collect impurities which may contaminate the semiconductor wafers. The wheel assemblies are mounted on the frame by means of stub shafts 13 and 14 projecting inwardly from side bars 2 and 3 respectively, the axes of the stub shafts in alignment with the asis of axle 10.

The manner of mounting the axle/wheel assembly on the stub shafts can be seen more clearly in the sectional drawing in FIG. 2 which shows that the outer face of each wheel has a central, circular recess 15 accepting a stub shaft so that the wheel assemblies can rotate about each pair of opposing stub shafts. The recess is a generally cylindrical cavity with a side wall 16 and a flat bottom 17. To minimize resistance to motion caused by friction between the moving parts, the contact areas between the stub shafts and recesses are highly polished and shaped to minimize that area. Thus, in FIG. 2, the ends 18 of the stub shafts in the recesses are rounded to reduce the area of the stub shafts in contact with the inner surfaces 17 of the recess. The recess may also be shaped to reduce that contact area. For example, the bottom 17 of the recess may be raised in a curved dome-like surface to oppose the similar shape at the end of the stub shaft.

Preferably, the internal diameter of the recess is about 10% greater than the external diameter of the stub shaft to allow sufficient clearance for rotation of the wheel assembly. For example, the diameter of the recess may be about 9 millimeters and that of the shaft about 8 millimeters. Tolerance between the bottom of the recess and the end of the stub shaft therein is generally considerably less. Typically there should be about twenty thousandths of an inch of play between the wheel assembly and opposing stub shafts.

The diameter of the recess is also preferably significantly greater than that of the axle, as shown in FIG. 2, to allow for passages 19 between the inner face of the wheel and the bottom of the recess adjacent its inner walls. Preferably, four of these passages ae provided, as shown in FIG. 4, arranged symmetrically around the periphery of the bottom surface of the recess. These passages shape this surface into spokes 21 with a central area 20 for contact with the end of the stub shaft and clearly should not be of a size to overly weaken the attachment of the wheel to the axle. The passages are for minimizing the collection of the contaminating particles in the recess and increasing gas flow around and through the carrier structure. The passages also simplify and assist cleaning of such particles from the recesses.

The carriers shown in the drawings is made entirely from refractory material, preferably quartz, to withstand the high furnace temperatures encountered in semiconductor processing. In use, a rack of semiconductor wafers is placed on the illustrated carrier and supported on the side bars between the two pairs of wheels.

It will be understood however that the illustrated carrier is only one example of a number of possible constructions using the type of wheel assembly mounting disclosed herein. While the carrier most conveniently has two pairs of wheels it may have only one pair or more than two. The rectangular frame shown in FIG. 1 is a convenient means for supporting the wheel assemblies through the stub shafts, but any arrangement which provides one or more pairs of opposing stub shafts may be used. While it is preferred from the standpoint of convenience of manufacture that the stub shafts project from a support means into recesses in the outer face of the wheels, the alternative construction where the stub shafts project from those faces into recesses in the support structure is also within the scope of this invention. Also, while the carrier illustrated in separable from the wafer rack, it will be appreciated that the rack and frame can be joined together or even of an integral construction which does not interfere with the mounting of the wheels and their rotation.

I claim:

1. A wheeled carrier, for transporting semiconductor wafers or other such items during processing, having at least one wheel assembly comprising a pair of wheels mounted on an axle to rotate with the axle, and having support means including a pair of opposing stub shafts in substantial alignment with the axle, each shaft extending into a central recess in the outer face of each wheel so that the wheel assembly is mounted on and can rotate about the pair of shafts, and lateral movement of the assembly is limited by the shafts engaging one or the other of the inner ends of the recesses.

2. A carrier as claimed in claim 1, wherein each pair of wheels and their axle are of unitary construction.

3. A carrier as claimed in claim 1 or 2, wherein the ends of the stub shafts are rounded to minimize their contact area with the recess surfaces to reduce frictional resistance to motion.

4. A carrier as claimed in claim 1 or 2, wherein contact areas of the stub shafts and recesses are highly polished to reduce frictional resistance to motion.

5. A carrier as claimed in claim 1 or 2, wherein said support means comprises a pair of parallel side bars having the stub shafts projecting inwardly therefrom and projecting into recesses in the center of the outer surfaces of the wheels, thereby mounting the wheel assemblies between the side bars.

6. A carrier as claimed in claim 5, wherein the side bars are of equal length and are braced at or near their ends by struts of equal length between the bars.

7. A carrier as claimed in claim 6, having two wheel assemblies, each being mounted towards the struts to provide a space between the assemblies for a rack for holding semiconductor wafers.

8. A carrier as claimed in claim 1 wherein the diameter of the recess is greater than that of the axle, each recess having one or more passages through the wheel from the bottom of the recess to the inner face of the wheel.

9. A carrier as claimed in claim 8, wherein the passages pass from adjacent the inner wall of the recess to adjacent the surface of the axle.

10. A carrier as claimed in claim 8 or 9, having a plurality of passages arranged symmetrically around the periphery of the bottom of the recess so that the bottom surface has a central area with the number of spokes extending radially therefrom to the inner wall of the recess.

11. A carrier as claimed in claim 1 wherein there is substantial tolerance between the stub shafts and the recesses such that the only frictional contact between the shafts and the wheels is that small area of the bottom of each recess engaging the portion of a shaft extending into each recess and the possible contact between the end of one of the shafts and the opposing inner wall of one of the recesses.

12. A carrier as claimed in claim 1 or 2 made entirely of quartz.

13. A wheeled carrier made of quartz or other such material for use in moving items into or out of a heat treating furnace comprising:
a frame including a pair of side supports;
a wheel assembly including an axle and a pair of spaced wheels, rigidly fixed to and to rotate with the axle; and
connection means rotatably connecting the wheel assembly to the side supports including a pair of stub shafts, each respectively mounted on one of said pairs at opposite ends of said axle in substantial alignment with the axle and with the end of each shaft being rotatably received in a surrounding recess, formed in the other of said pairs, the mating shaft and recesses being formed with substantial tolerance therebetween so as to minimize the engaging friction contact area between a shaft and its recess, while the shafts and the inner ends of the recesses limit lateral movement of the wheel assembly preventing the wheels from engaging the side supports.

14. The carrier of claim 12 wherein each stub shaft is fixed to a respective one of said side supports and each wheel has one of said recesses formed in its outer face.

* * * * *